United States Patent
Ray et al.

(10) Patent No.: US 9,913,371 B2
(45) Date of Patent: Mar. 6, 2018

(54) PRINTING COMPLEX ELECTRONIC CIRCUITS USING A PATTERNED HYDROPHOBIC LAYER

(71) Applicant: Nthdegree Technologies Worldwide Inc., Tempe, AZ (US)

(72) Inventors: William Johnstone Ray, Fountain Hills, AZ (US); Richard Austin Blanchard, Los Altos, CA (US); Mark David Lowenthal, Vancouver, WA (US); Bradley Steven Oraw, Chandler, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 0 days.

(21) Appl. No.: 15/405,601

(22) Filed: Jan. 13, 2017

(65) Prior Publication Data

US 2017/0135214 A1    May 11, 2017

Related U.S. Application Data

(63) Continuation-in-part of application No. 14/204,800, filed on Mar. 11, 2014, now Pat. No. 9,572,249.
(Continued)

(51) Int. Cl.
*H05K 1/00* (2006.01)
*H05K 1/02* (2006.01)
(Continued)

(52) U.S. Cl.
CPC ........... *H05K 1/0296* (2013.01); *H01L 24/24* (2013.01); *H01L 24/25* (2013.01); *H01L 24/82* (2013.01);
(Continued)

(58) Field of Classification Search
CPC .................. H01L 21/563; H01L 23/3121
(Continued)

(56) References Cited

U.S. PATENT DOCUMENTS

| 6,507,989 B1 | 1/2003 | Bowden et al. |
| 8,360,601 B2 * | 1/2013 | Muschaweck ............ F21K 9/00 362/231 |

(Continued)

OTHER PUBLICATIONS

PCT/US2014/026081 International Search Report and Written Opinion, dated Sep. 23, 2014, 21 pages.

*Primary Examiner* — Binh Tran
(74) *Attorney, Agent, or Firm* — Patent Law Group LLP; Brian D. Ogonowsky

(57) ABSTRACT

A programmable circuit includes an array of printed groups of microscopic transistors or diodes. The devices are preformed and printed as an ink and cured. A patterned hydrophobic layer defines the locations of the printed dots of the devices. The devices in each group are connected in parallel so that each group acts as a single device. Each group has at least one electrical lead that terminates in a patch area on the substrate. An interconnection conductor pattern interconnects at least some of the leads of the groups in the patch area to create logic circuits for a customized application of the generic circuit. The groups may also be interconnected to be logic gates, and the gate leads terminate in the patch area. The interconnection conductor pattern then interconnects the gates for form complex logic circuits.

20 Claims, 9 Drawing Sheets

Related U.S. Application Data

(60) Provisional application No. 62/278,710, filed on Jan. 14, 2016, provisional application No. 61/785,292, filed on Mar. 14, 2013.

(51) Int. Cl.

| | | |
|---|---|---|
| *H01L 25/07* | (2006.01) | |
| *H01L 25/075* | (2006.01) | |
| *H01L 25/18* | (2006.01) | |
| *H01L 25/00* | (2006.01) | |
| *H01L 33/20* | (2010.01) | |
| *H05K 1/18* | (2006.01) | |
| *H05K 7/00* | (2006.01) | |
| *H01L 21/00* | (2006.01) | |
| *H01L 23/31* | (2006.01) | |
| *H01L 21/56* | (2006.01) | |
| *H01L 23/00* | (2006.01) | |
| *H01L 25/065* | (2006.01) | |

(52) U.S. Cl.
CPC ............ *H01L 24/95* (2013.01); *H01L 25/072* (2013.01); *H01L 25/0753* (2013.01); *H01L 25/18* (2013.01); *H01L 25/50* (2013.01); *H01L 33/20* (2013.01); *H01L 21/563* (2013.01); *H01L 23/3121* (2013.01); *H01L 24/06* (2013.01); *H01L 24/32* (2013.01); *H01L 24/73* (2013.01); *H01L 24/92* (2013.01); *H01L 25/0655* (2013.01); *H01L 2221/68381* (2013.01); *H01L 2224/06181* (2013.01); *H01L 2224/24137* (2013.01); *H01L 2224/25105* (2013.01); *H01L 2224/25174* (2013.01); *H01L 2224/32225* (2013.01); *H01L 2224/73267* (2013.01); *H01L 2224/82101* (2013.01); *H01L 2224/82104* (2013.01); *H01L 2224/82143* (2013.01); *H01L 2224/92244* (2013.01); *H01L 2224/95085* (2013.01); *H01L 2224/95101* (2013.01); *H01L 2224/95102* (2013.01); *H01L 2224/95115* (2013.01); *H01L 2224/95143* (2013.01); *H01L 2224/95146* (2013.01); *H01L 2924/10253* (2013.01); *H01L 2924/12* (2013.01); *H01L 2924/1203* (2013.01); *H01L 2924/12041* (2013.01); *H01L 2924/13* (2013.01); *H01L 2924/1301* (2013.01); *H01L 2924/1305* (2013.01); *H01L 2924/13034* (2013.01); *H01L 2924/13062* (2013.01); *H01L 2924/13091* (2013.01)

(58) Field of Classification Search
USPC ......... 361/748, 760, 761; 438/107, 110, 111, 438/112, 127, 128
See application file for complete search history.

(56) References Cited

U.S. PATENT DOCUMENTS

| | | | |
|---|---|---|---|
| 2007/0279377 | A1 | 12/2007 | Hillis et al. |
| 2010/0317132 | A1 | 12/2010 | Rogers et al. |
| 2013/0026509 | A1* | 1/2013 | Tohyama ............. H01L 25/167 257/88 |
| 2013/0258636 | A1* | 10/2013 | Rettke ................ H01L 25/0753 362/84 |
| 2014/0148879 | A1* | 5/2014 | Mersch ............... A61N 1/0476 607/90 |

* cited by examiner

|  | MOS | BIPOLAR |
|---|---|---|
| TOP | GATE | EMITTER |
| INTERMEDIATE | SOURCE BODY | BASE |
| BOTTOM | DRAIN | COLLECTOR |
| EFFECT IF UPSIDE DOWN | GATE IS BOTTOM CONTACT. THEREFORE, AN OPEN CIRCUIT. | COLLECTOR AND EMITTER REVERSED WITH BASE FLOATING. REVERSE BIASED DIODE. |
FIG. 9
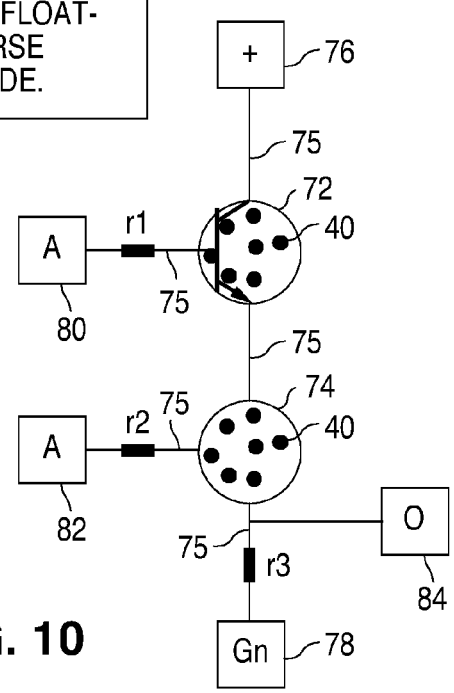
FIG. 10
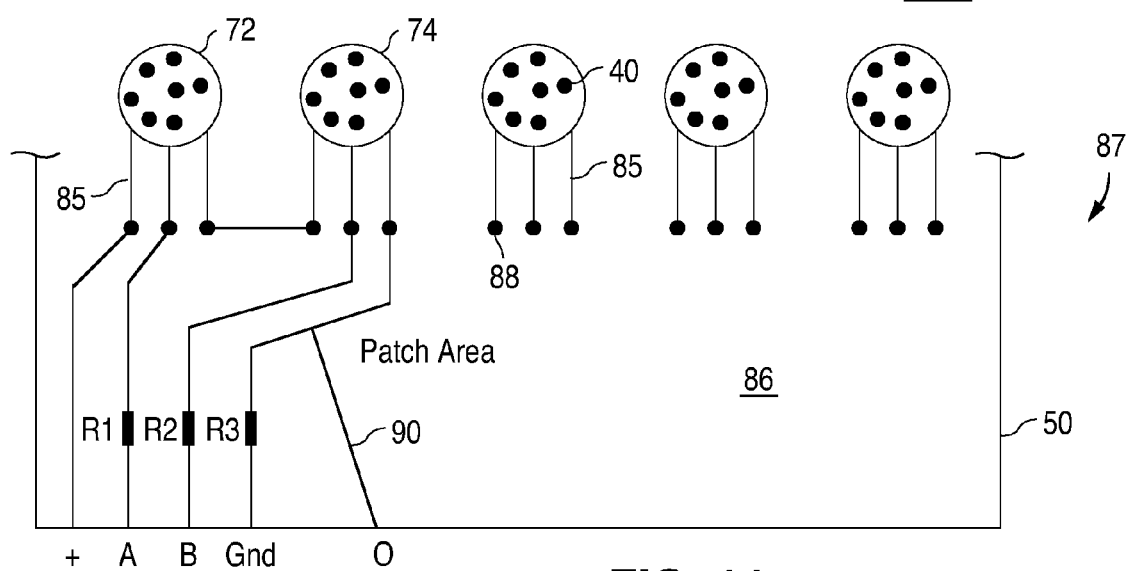
FIG. 11

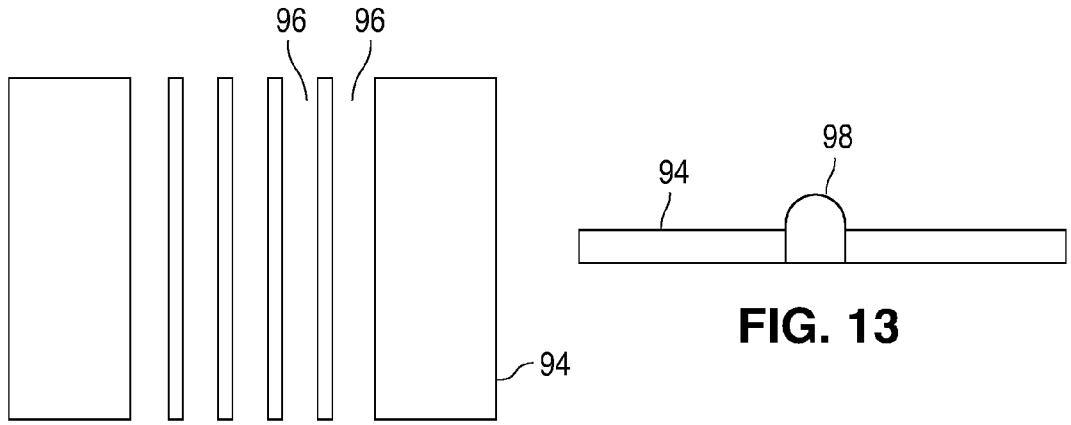
FIG. 12
FIG. 13
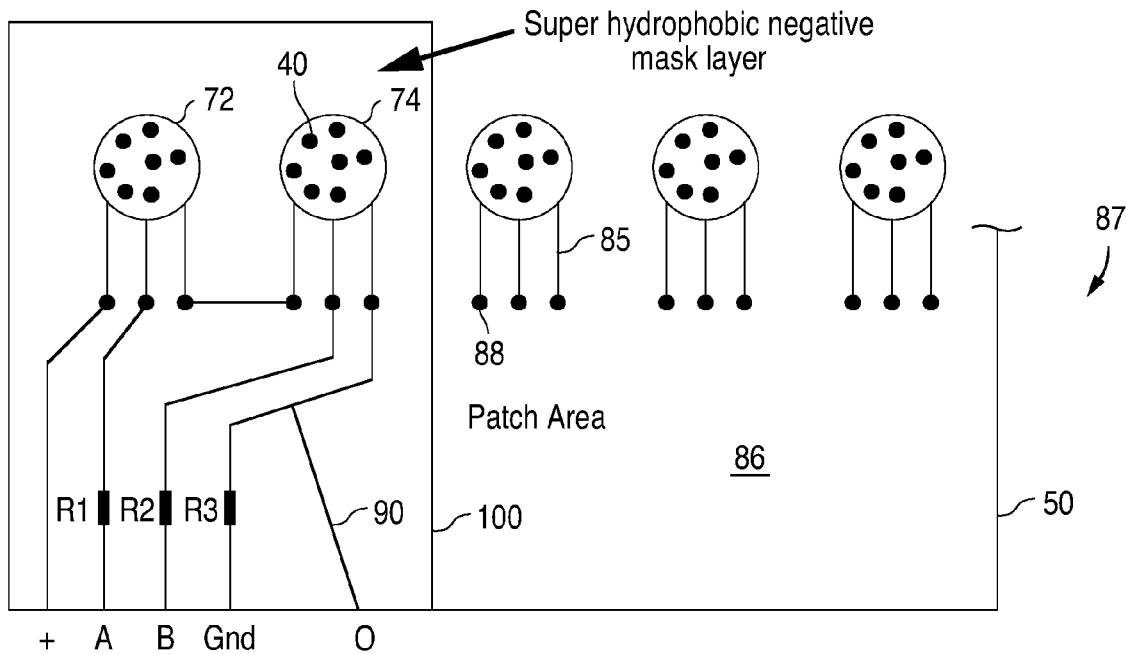
FIG. 14
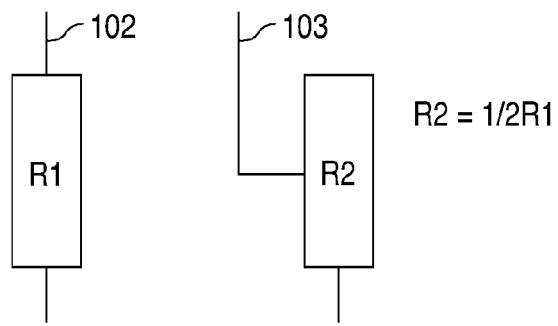
FIG. 15

PRINTING COMPLEX ELECTRONIC CIRCUITS USING A PATTERNED HYDROPHOBIC LAYER

CROSS-REFERENCE TO RELATED APPLICATIONS

This application claims priority to U.S. provisional application Ser. No. 62/278,710, filed Jan. 14, 2016, and is also a continuation-in-part of U.S. application Ser. No. 14/204,800, filed Mar. 11, 2014, which claims priority to U.S. provisional application Ser. No. 61/785,292 filed Mar. 14, 2013, by William Johnstone Ray et al., assigned to the present assignee and incorporated herein by reference.

FIELD OF THE INVENTION

This invention relates to printing pre-formed, microscopic semiconductor devices, such as transistors and diodes, in separate groups on a substrate, where the randomly distributed devices in each group are connected in parallel, and interconnecting the groups to create more complex circuits, such as logic circuits.

BACKGROUND

It is known, by the present assignee's own work, how to form and print microscopic 2-terminal vertical light emitting diodes (LEDs), with the proper orientation, on a conductive substrate and connect the LEDs in parallel to form a light sheet. Details of such printing of LEDs can be found in US application publication US 2012/0164796, entitled, Method of Manufacturing a Printable Composition of Liquid or Gel Suspension of Diodes, assigned to the present assignee and incorporated herein by reference.

FIG. 1 is a cross-sectional view of a layer of LEDs 16 that may be printed using the following process. Each LED 16 includes standard semiconductor GaN layers, including an n-layer, and active layer, and a p-layer.

An LED wafer, containing many thousands of vertical LEDs, is fabricated so that the bottom metal cathode electrode 18 for each LED 16 includes a reflective layer. The top metal anode electrode 20 for each LED 16 is small to allow almost all the LED light to escape the anode side. A carrier wafer, bonded to the "top" surface of the LED wafer by an adhesive layer, may be used to gain access to both sides of the LED for metallization. The LEDs 16 are then singulated, such as by etching trenches around each LED down to the adhesive layer and dissolving the exposed adhesive layer or by thinning the carrier wafer.

The microscopic LEDs are then uniformly infused in a solvent, including a viscosity-modifying polymer resin, to form an LED ink for printing, such as screen printing or flexographic printing.

If it is desired for the anode electrodes 20 to be oriented in a direction opposite to the substrate 22 after printing, the electrodes 20 are made tall so that the LEDs 16 are rotated in the solvent, by fluid pressure, as they settle on the substrate surface. The LEDs 16 rotate to an orientation of least resistance. Over 90% like orientation has been achieved.

In FIG. 1, a starting substrate 22 is provided. If the substrate 22 itself is not conductive, a reflective conductor layer 24 (e.g., aluminum) is deposited on the substrate 22 such as by printing. The substrate 22 may be thin and flexible.

The LEDs 16 are then printed on the conductor layer 24 such as by flexography, where a pattern on a rolling plate determines the deposition for a roll-to-roll process, or by screen printing with a suitable mesh to allow the LEDs to pass through and control the thickness of the layer. Because of the comparatively low concentration, the LEDs 16 will be printed as a monolayer and be fairly uniformly distributed over the conductor layer 24.

The solvent is then evaporated by heat using, for example, an infrared oven. After curing, the LEDs 16 remain attached to the underlying conductor layer 24 with a small amount of residual resin that was dissolved in the LED ink as a viscosity modifier. The adhesive properties of the resin and the decrease in volume of resin underneath the LEDs 16 during curing press the bottom LED electrode 18 against the underlying conductor 24, making ohmic contact with it.

A dielectric layer 26 is then printed over the surface to encapsulate the LEDs 16 and further secure them in position.

A top transparent conductor layer 28 is then printed over the dielectric layer 26 to electrically contact the electrodes 20 and is cured in an oven appropriate for the type of transparent conductor being used.

If needed to spread current, metal bus bars 30-33 are then printed along opposite edges of the conductor layers 24 and 28 and electrically terminate at anode and cathode leads (not shown), respectively, for energizing the LEDs 16. The bus bars 30-33 will ultimately be connected to a positive or negative driving voltage.

FIG. 2 is a top down view of FIG. 1. The cross-section of FIG. 2 is a horizontal bisection of FIG. 3. The locations of the LEDs 16 in the printed layer are random.

If a suitable voltage differential is applied to the anode and cathode leads, all the LEDs 16 with the proper orientation will be illuminated. FIG. 1 shows a light ray 38.

The above process is strictly for use with 2-terminal devices having a top electrode and a bottom electrode, since the locations of the LEDs on the substrate are random, and the LEDs can only be interconnected by sandwiching the LEDs between two conductive layers of any thickness. Further, the above process is strictly for forming an array of LEDs for generating light. The LEDs are not intended to perform any type of logic function since the array of parallel-connected LEDs simply forms a single diode.

It would be desirable to adapt the above-described printing/curing process to create complex printed electrical circuits involving 3-terminal transistors, diodes, and possibly additional types of components, to perform logic functions.

SUMMARY

The present invention is broadly related to printing preformed, microscopic (e.g., dimensions between 10-200 microns) electronic devices, including transistors and diodes, in small separate groups on a substrate, such as a flex-circuit. Each group may contain, for example, about 10 of the devices. The devices in each group are connected in parallel using printed conductor layers.

Each group acts as a single device (e.g., a single transistor or a single diode), since the same devices are connected in parallel in each group. At any time after the groups are formed, the groups are then interconnected (programmed) to form a customized circuit, such as a logic circuit for performing a specified function.

In one embodiment, the printed devices are transistors or diodes, and the programming step forms a plurality of logic gates. In another embodiment, the substrate is initially processed to create an array of logic gates from the groups, and a subsequent "programming" step customizes the substrate by interconnecting the gates to form a complex logic circuit. Therefore, the printed substrate may form a programmable gate array.

In one embodiment, the "programming" to create the circuit is performed by forming a hydrophobic mask on the substrate, defining the interconnection pattern, and then depositing a conductive material to form interconnecting metal traces on the substrate. In another embodiment, the interconnecting traces are directly printed on the substrate by flexography or screen printing.

The groups of devices may all be the same devices (e.g., transistors) or a variety of devices (e.g., transistors and diodes). The circuits may be other than logic circuits, such as control circuits, switching circuits, analog circuits, etc.

Many types of electrical components use three terminals, such as MOSFETs, bipolar transistors, JFETs, thyristors, silicon controlled rectifiers, etc. Conventional ones of such components typically have three terminals on the top, for lateral devices, or two terminals on top and one on the bottom, for vertical devices. It is known to form thin film transistors by printing the various transistor layers over a substrate, but the performance of such printed transistors is poor due to the difficulty of printing a single crystal. If transistors (or other 3-terminal devices) could be more conventionally formed in a semiconductor wafer and then singulated to create microscopic devices for printing as an ink, the quality of the devices may be state of the art. However, heretofore it is not known how to design such devices or to interconnect such 3-terminal microscopic devices after printing to perform complex functions.

In one embodiment, a semiconductor (e.g., silicon) wafer of 3-terminal devices, such as transistors, is formed. The transistors are formed in the wafer to have a bottom electrode, a top electrode, and an intermediate electrode that is located on a shelf somewhere between the top and bottom of the device. The starting wafer is ultimately affixed to a carrier wafer, by an adhesive, to gain access to both surfaces of the transistors when fabricating them.

The transistors are singulated into individual transistors by forming trenches around each transistor, such as to form hexagonal devices. The trenches extend down to the adhesive layer, and the adhesive layer is dissolved in a solution, releasing all the transistors from the carrier wafer.

The transistors are then uniformly mixed into a solution to form an ink. The shapes of the transistors cause a vast majority them to be printed in the desired orientation on a substrate.

The transistors are then printed to form an array of groups of transistors on associated first conductor layer portions over a substrate, and the ink is cured (heated and evaporated), so that the bottom electrode of each transistor makes ohmic contact to these first conductor layer portions. The transistors will be printed as a loose monolayer due to the relatively low density of the transistors in the solution. The printing of any layers in the product may be by flexography (particularly suited for a roll-to-roll process), screen printing (particularly suited when forming flat sheets), or other types of printing.

A first dielectric layer is then printed over the first conductor layer portions. The first dielectric layer does not cover the intermediate electrode. Second conductor layer portions, aligned with the first conductor layer portions, are then printed, which contact the intermediate electrode but do not cover the top electrode. The various thin printed layers self-planarize by a strong surface tension so that the layer does not cover any features "above" the thickness of the layer. Alternatively, the layers may be blanket etched after curing to expose any electrodes.

A second dielectric layer is then printed over the second conductor layer portions but not over the top electrode. Top (third) conductor layer portions are then printed to contact the top electrode of the transistors in each group.

Therefore, the top electrodes of the transistors are connected in parallel, the bottom electrodes are connected in parallel, and the intermediate electrodes (or a subset of them) are connected in parallel for conducting a wide range of currents.

As previously mentioned, the groups may then be interconnected in a programming step to form logic gates or more complex circuits.

Instead of transistors, microscopic vertical diodes may be printed, and only two conductor layers are needed to connect the diodes in each group in parallel.

For simple passive devices such as resistors, the resistive material itself (rather than printing an ink containing individual resistors) may be printed in a small area, and the resistance is determined by where a conductor contacts the resistor along its length.

Different areas of the substrate may be printed with different devices or the same devices, and the devices in each area are connected in parallel. Therefore, each area is essentially a single device. The conductor layers terminate in connector areas on the substrate next to each area.

In one embodiment, the substrate may have a designated "patch" area where the interconnections of the groups or the gates are made. This simplifies the design of the programmed interconnection, since the patch area may be optimized for the programming step.

The devices are formed such that, if some of the devices in a group are printed upside down or make a poor connection, there is no adverse effect on the functions of the properly orientated devices in the group.

The printing process may use a roll-to-roll process at atmospheric pressures. The cost of the printed programmable substrates is much lower than the cost of comparable programmable substrates formed using conventional techniques.

In another embodiment, the areas where the device ink and conductors are formed are defined by a patterned omniphobic layer on the substrate. This enables a more precise printed dot shape with no ink spreading, which enables smaller dots and a denser array of dots. Thus, more electrical components can be printed in a unit area to form more complex circuits. The entire circuit may be formed by printing under atmospheric conditions.

Other embodiments are disclosed.

BRIEF DESCRIPTION OF THE DRAWINGS

FIG. 1 is taken across a horizontally bisected FIG. 2.

FIG. 9 is a chart identifying preferred functions of the top, bottom, and intermediate electrodes for MOSFETs and bipolar transistors.

FIG. 10 illustrates interconnecting groups of transistors to form a logic circuit.

FIG. 11 illustrates how the leads for the various groups of devices may be brought to a patch area of the substrate for interconnecting the groups. In another embodiment, the leads of logic gates (e.g., NAND gates) made from the groups may be brought to the patch area.

FIG. 12 is a top down view of conductors being patterned using a hydrophobic mask.

FIG. 13 is a cross-sectional view of one of the conductor lines formed using the mask of FIG. 12.

FIG. 14 illustrates how the hydrophobic mask may be used for form conductor lines to interconnect groups of devices to form logic circuits.

FIG. 15 illustrates how resistor values may be determined by the location of a conductor contacting printed resistive material.

Elements that are similar or identical in the various figures are labeled with the same numeral.

DETAILED DESCRIPTION

The printed programmable circuits of the present invention may use any combination of passive devices (e.g., capacitors, resistors), 2-terminal inorganic semiconductor devices (e.g., diodes), and 3-terminal inorganic semiconductor devices (e.g., transistors). The most complex device to print and electrically connect to is a 3-terminal device. In some cases, a 3-terminal device, such a bipolar transistor, may be used as a diode by only using two of the terminals or connecting two terminals to the same conductor.

The 3-terminal devices used in embodiments of the present invention may be less than the diameter of a human hair, rendering them essentially invisible to the naked eye when the devices are sparsely spread across a substrate. The sizes of the devices may range from about 10-200 microns across. The number of micro-devices per unit area may be freely adjusted when applying the micro-devices to the substrate. The devices may be printed as an ink using flexography, screen printing, or other forms of printing. Conventional designs for 3-terminal devices may be easily adapted for forming the micro-devices of the present invention. The precision of photolithography is well within the precision needed to form the micro-devices. Since many of the micro-devices will be operating in parallel, the efficiency of each micro-device is not critical.

Figure 3:
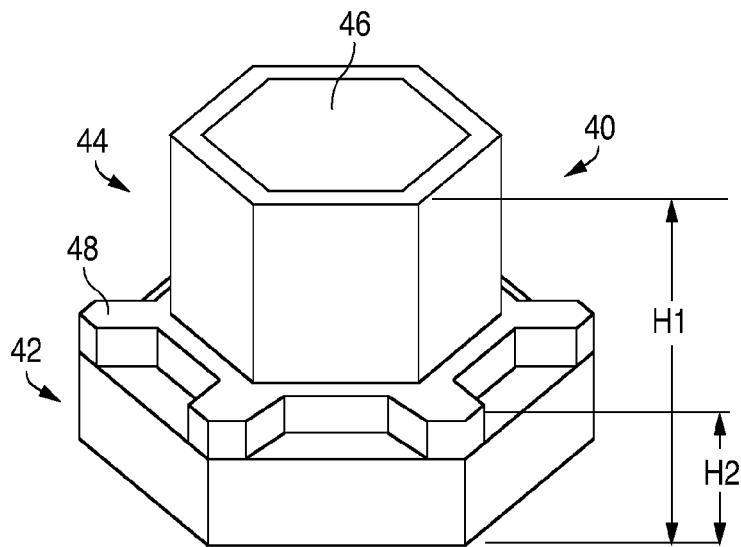
FIG. 3 is a perspective view of a single 3-terminal transistor that has been singulated from a wafer, in accordance with one embodiment of the invention. The transistors are mixed into a solution to form an ink for printing on a substrate.

FIG. 3 is a perspective view of a 3-terminal device 40 that can be suspended in a solvent and printed as an ink on a substrate. The device 40 may be a bipolar transistor, a MOSFET, a JFET, a tri-MOS device, or any other 3-terminal device, generally including two current carrying terminals and a control terminal. The device 40 can be a lateral or vertical transistor, since the positions of the three electrodes do not dictate the locations of the semiconductor layers/regions or gates inside the device 40. The electrodes may contact any location in the device 40 using vias.

The devices 40 are completely formed on a semiconductor wafer, including the electrode metallizations, by using one or more carrier wafers during the processing to gain access to both surfaces for metallization. Although the growth wafer may be silicon, the carrier wafer may be any material. The silicon wafer is affixed to the carrier wafer using an adhesive or other suitable material. The shape of each device 40 is defined by masking and etching. Various layers or regions may be doped using masked implantation or by doping the layers while being epitaxially grown. After the devices are formed on the wafer, trenches are photolithographically defined and etched in the front surface of the wafer around each device 40 down to the adhesive layer. A preferred shape of each device 40 is hexagonal. The trench etch exposes the underlying wafer bonding adhesive. The adhesive is then dissolved in a solution to release the devices 40 from the carrier wafer. Singulation may instead be performed by thinning the back surface of the carrier wafer until the devices 40 are singulated. The microscopic devices 40 are then uniformly infused in a solvent, including a viscosity-modifying polymer resin, to form an ink for printing, such as screen printing or flexographic printing.

A similar technique may be used to form 2-terminal devices, such as a vertical diode, with one electrode on top and another electrode on the bottom. The diode may have a shape similar to that shown in FIG. 3 but without the middle electrode.

Details regarding shaping vertical LEDs (2-terminal devices) in a wafer and then singulating the LEDs for printing as an ink are described in US application publication US 2012/0164796, entitled, Method of Manufacturing a Printable Composition of Liquid or Gel Suspension of Diodes, assigned to the present assignee and incorporated herein by reference. One skilled in the art may adapt such processes for forming the 3-terminal device 40 and non-LED diodes.

The device 40 has two sections: a lower section 42 (or base portion) and an upper section 44. The upper section 44 is made relatively tall and narrow so that the devices 40 are rotated in the solvent, by fluid pressure, as they settle on the substrate surface. The devices 40 rotate to an orientation of least resistance. Over 90% like orientation has been achieved, although satisfactory performance may be achieved with over 75% of the devices 40 being in the same orientation.

Figure 4:
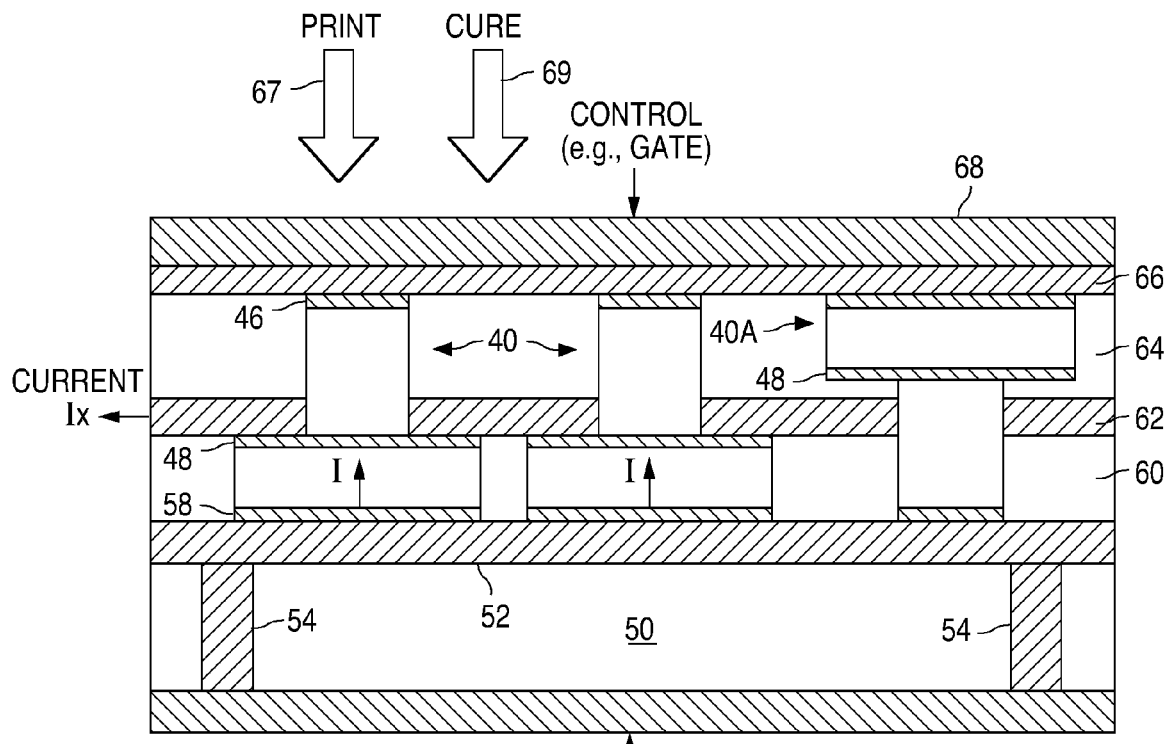
FIG. 4 is a cross-section of a small portion of a printed layer of the transistors of FIG. 3 connected in parallel using three planes of conductor layers. About 10 of the parallel-connected transistors may be printed in each separate group, and an array of the groups is printed over the substrate.

The lower section 42 should be shaped so that the device 40 sits flat on the substrate after the ink is cured. FIG. 4 illustrates three printed devices 40, where only two are printed with the correct orientation.

The device 40 includes a metal top electrode 46, a metal intermediate electrode 48, and a metal bottom electrode (not shown in FIG. 3). The shape of the intermediate electrode 48 provides a large side surface area for good electrical contact with an intermediate conductor layer.

The intermediate electrode 48 should be offset with respect to the middle of the device 40 so that an improper orientation of the device 40 after printing results in the intermediate electrode 48 not electrically contacting the intermediate conductor layer. In the example, the intermediate electrode 48 is below the middle of the device 40 (i.e., H2<½ H1).

In FIG. 4, a starting substrate 50 is provided. The substrate 50 is preferably thin and flexible for light weight, low cost, good heat conduction to air or a heat sink, and ease of processing. The substrate 50 may be a suitable polymer, such as polycarbonate, PMMA, or PET, and may be flexible so as to be dispensed from a roll. The substrate 50 can be any size suitable for the ultimate product. The substrate 50 may be a conventional flex-circuit substrate, where metal (e.g., copper) traces have been already formed on the substrate 50 by conventional means prior to the below processing steps.

If the substrate 50 does not already have metal traces formed on it as a flex-circuit, a conductor layer 52 (e.g., silver, aluminum, copper) is deposited on the substrate 50 such as by printing. Conductive vias 54 through the substrate 50 may be used to couple the conductor layer 52 to a metal layer 56 formed on the bottom surface of the substrate 50. In the various examples, the conductor layer 52 is printed as an array of circular spots on the substrate 50 (see FIG. 11). The spots are electrically isolated from one another to allow groups of the devices 40 to be interconnected in any manner to form logic circuits. Instead of circular spots, the conductor layer 52 may be printed in square spots or other shaped spots.

The devices 40 are then printed on the conductor layer 52 such as by flexography or by screen printing with a suitable mesh to allow the devices 40 to pass through and control the thickness of the layer. Because of the comparatively low concentration, the devices 40 will be printed as a loose monolayer and be fairly uniformly distributed over the conductor layer 52. The printed locations of the devices 40 align with the locations of the printed spots of the conductor layer 52.

The solvent is then evaporated by heat using, for example, an infrared oven. After curing, the devices 40 remain attached to the underlying conductor layer 52 with a small amount of residual resin that was dissolved in the ink as a viscosity modifier. The adhesive properties of the resin and the decrease in volume of resin underneath the devices 40 during curing press the bottom electrode 58 against the underlying conductor layer 52, making ohmic contact with it.

A thin dielectric layer 60 is then printed to cover the conductor layer 52 and further secure the devices 40 in position. The dielectric layer 60 is designed to self-planarize during curing, by surface tension, so as to pull off of or de-wet the top electrode 46 and the intermediate electrode 48. Therefore, etching the dielectric layer 60 is not required. If the dielectric layer 60 covers the electrodes 46/48, then a blanket etch may be used to expose the electrodes 46/48.

An intermediate conductor layer 62, aligned with the spots of the conductive layer 52, is then printed over the dielectric layer 60 to electrically contact the intermediate electrode 48 and is cured in an oven appropriate for the type of conductor being used. The various conductor layers may be metal (or contain metal) or be any other type of printable conductor layer.

Another thin dielectric layer 64 is printed over the intermediate conductor layer 62 so as not to cover the top electrode 46.

A top conductor layer 66, aligned with the spots of the intermediate conductor layer 62, is then printed over the dielectric layer 64 to electrically contact the top electrode 46 and is cured in an oven appropriate for the type of conductor being used.

A thicker metal layer 68 may then be printed over the conductor layer 66 for improving electrical conductivity and/or heat conduction. The intermediate conductor layer 62 extends out from the edge of the spot to form a terminal of the group of the devices 40.

Figure 1:
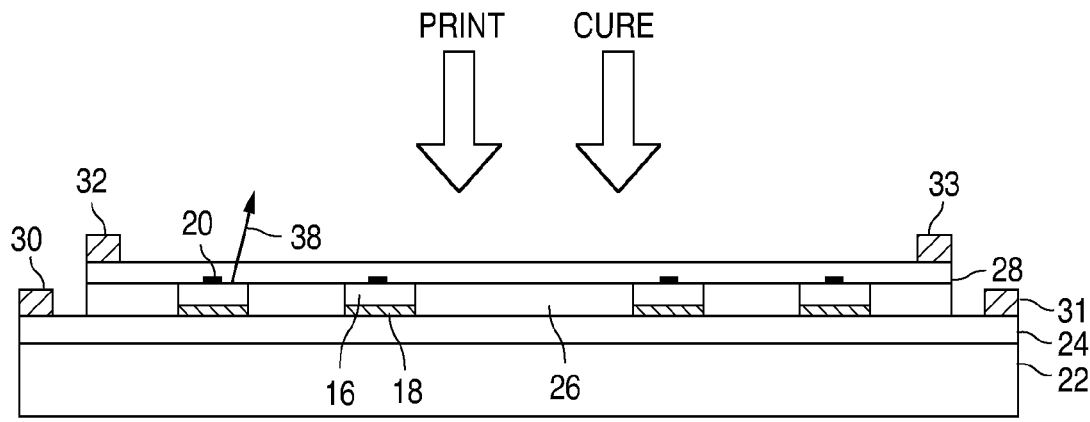
FIG. 1 is a cross-section of a loose monolayer of printed, microscopic vertical LEDs that may be formed using the assignee's prior art process.
Figure 2:
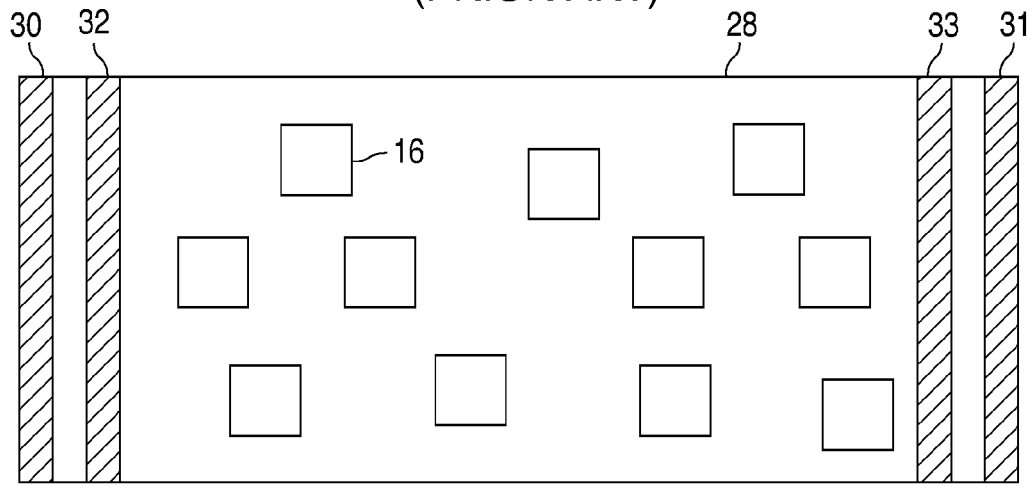
FIG. 2 is a top down view of the structure of FIG. 1, where

FIG. 4 illustrates that the only steps needed to form the structure of FIG. 4 are printing and curing steps 67 and 69. The random pattern of the devices 40 may resemble the pattern of LED 16 in FIG. 2.

FIG. 4 illustrates that the rightmost device 40A is oriented in the opposite direction. However, the intermediate electrode 48 is left floating, so the device 40A does not operate and has no effect on the resulting circuit.

The printed devices 40 are connected in parallel by the conductor layers. Suitable operating voltages and control voltages are applied to the conductor layers to operate the devices 40. In the example of FIG. 4, the top electrode 46 is the control electrode for the devices 40 (e.g., for gates or bases). The remaining two electrodes are the current carrying electrodes (e.g., source/drain, emitter/collector). Since the intermediate electrode 48 of the improperly oriented device 40A is floating, the device 40 remains off and an open circuit.

Figure 5:
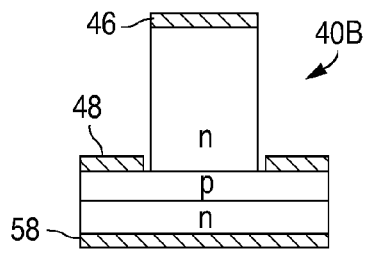
FIG. 5 illustrates how the transistor of FIG. 3 may be an npn bipolar transistor.

FIG. 5 illustrates how the device 40 may be an npn bipolar transistors 40B, where the intermediate electrode 48 is the base electrode. The intermediate electrode 48 may be connected to any of the other semiconductor layers in the device 40B using a via.

Figure 6:
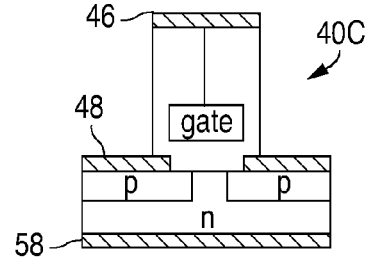
FIG. 6 illustrates how the transistor of FIG. 3 may be a p-channel MOSFET.

FIG. 6 illustrates how the device 40 may be a p-channel MOSFET 40C, where the intermediate electrode 48 is the source electrode. The intermediate electrode 48 may be connected to any of the other layers in the device 40C using a via.

If the devices 40 are to be connected as diodes, only conductor layers 62 and 52 or 66 and 62 may be used.

Accordingly, the effective polarity of the diode may be selected by which two conductor layers are used to contact the diodes. Alternatively, two conducting layers may be connected remotely to form a diode.

Any number of the devices 40 may be connected in parallel in a group for handling a wide range of currents. In one embodiment, about 10 devices 40 are located in each group. The groups of the devices 40 are printed as a 2-dimensional array of groups, such as by using a pattern on a roller in a flexography print process or by using a mask on a screen print mesh, and the various conductor layers may be similarly patterned so that the devices 40 in each group are connected in parallel, but each group is electrically isolated from one another. Therefore, each group forms a separate component. The groups may then be selectively interconnected using "programming" conductor traces on the substrate 50 to form more complex circuits, such as logic circuits. A metal flex-circuit pattern on the substrate 50 may be used to interconnect the groups of devices 40 for form the logic circuits. In one embodiment, since each group may be as small as a millimeter per side or a millimeter in diameter, a 2-dimensional array of such groups may exceed several thousand groups. Groups within a small area may be interconnected to form logic gates, and the terminals of the gates may be interconnected during programming to perform any logic function.

Figure 7:
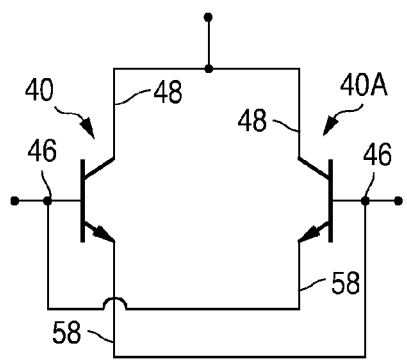
FIGS. 7 and 8 illustrate how some transistors may be "incorrectly" interconnected by improper orientations of the transistors when printing, where the interconnections do not adversely affect the functions of the properly oriented transistors.

FIG. 7 illustrates how the improper orientation of the device 40A in FIG. 4 does not adversely affect the operation of the properly oriented devices 40 in the group connected in parallel. The device 40/40A is assumed to be an npn bipolar transistor with a top electrode 46 for the base, a bottom electrode 58 for the emitter, and an intermediate electrode 48 for the collector. Since the device 40A is undesirably oriented upside down during printing (shown in FIG. 4), its base is shorted to the emitter of the device 40 and its emitter is shorted to the base of the device 40. When the base/emitter junction of the device 40 is forward biased to turn on the device 40, the device 40A remains off and has no effect on the operation of the device 40. Note that, by using an intermediate electrode 48 that is offset from the middle of the device 40 (as shown in FIGS. 3 and 4), the intermediate electrode 48 of the device 40A would be floating, making its effect even more insignificant.

Figure 8:
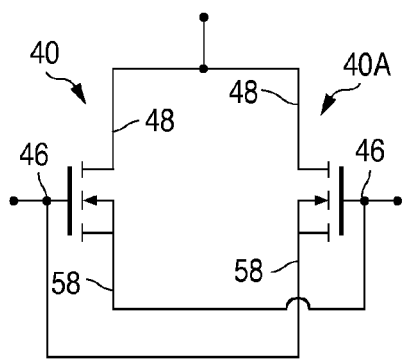

FIG. 8 is similar to FIG. 9 but the devices 40 and 40A are MOSFETs.

FIG. 9 is a table showing possible connections for the top, bottom, and intermediate electrodes of the device 40 formed as a MOSFET or a bipolar transistor so that improper orientations do not adversely affect the functions of the properly oriented devices 40 connected in parallel.

FIG. 10 illustrates two groups, 72 and 74, of printed npn bipolar transistors (e.g., devices 40), where the transistors in each group are connected in parallel so that each group acts as a single transistor. The print patterns for the devices 40 and conductor layers form the groups as circular spots, but any shaped spot may be used. The interconnections of the groups in FIG. 4 cause the circuit to be an AND gate. The conductive traces 75 connect to the various conductor layers in FIG. 4 for each group. The two transistors (i.e., groups 72 and 74) are connected in series between the supply voltage terminals 76 and 78, the bases of the transistors are connected to the input terminals 80 and 82, and the output terminal 84 is connected to the emitter of the transistor formed by group 74. The various terminals may be near the edges of the substrate 50 or proximate to the groups.

Resistors r1 and r2 are shown connected between the input terminals 80/82 and the bases for current control. Due to the simplicity of resistors, the resistive material may be directly patterned on the substrate with a patterned roller using flexography or a mask on a screen mesh used to print the resistive material. Either the shape of the resistive material may determine the resistance or the position of the connector along its length may determine the resistance. A resistor may also be included on each device 40. Capacitors may also be formed by printing the layers of the capacitors.

The substrate 50 may contain hundreds or thousands of such AND gates, or other gates, and the gates may be interconnected to form more complex functions. In such a case, the gates are equivalent to a programmable gate array. For a more flexible circuit, the groups may be initially unconnected, and the programming mask for the interconnections may determine the final circuit. Three-dimensional programming may be used to allow the crossing over of traces. Any combination of gates and other logic circuitry may be created. Some groups may include transistors and other groups may contain other devices, such as diodes. Analog circuits may also be formed by interconnecting the various groups.

Due to the random but substantially uniform distribution of the devices 40 in the ink, each group of the same area will have approximately the same number of devices 40. Minor differences in the number of devices 40 in a group will not affect the performance of a logic circuit. In one embodiment, there may be about 10 identical devices in each group due to the low currents required. The cost of the devices 40 in a single group, representing a single transistor, is about 0.143 cents. So the resulting circuit board may be made relatively inexpensively.

As shown in FIG. 11, to simplify the programming of the groups, which may be printed in an ordered 2-dimensional array, conductive traces 85, originating at the conductor layers (FIG. 4) for all the groups, may terminate at a patch area 86 on the substrate 50, where the product is now a programmable circuit board 87. These traces 85 may be part of the "standard" design of the circuit board 87, which is then later customized for a particular use. This enables the printing process for forming the traces 85 to be optimized for connection to the conductor layers in the groups and the programming process to be optimized for interconnecting the ends of the terminals 88. For example, the programming process may be performed at a time after the circuit board 87 has been fabricated, and the programming step may be performed by special equipment under computer control. Further, the pattern of the interconnections may be much more complex than the traces 85 that electrically connect the transistor terminals to the patch area 86.

In the example of FIG. 11, the programming in the patch area 86 forms the AND gate of FIG. 10. For more complex circuits, the programming traces 90 may need to cross, and multiple layers may be formed to avoid shorting of the traces.

In another embodiment, the groups of devices 40 may be initially interconnected proximate to the groups to form separate logic gates, such as AND, NAND, NOR gates, and the leads for each gate terminate in the patch area 86 for later programming to customize the substrate for a particular customer. Accordingly, the generic circuit forms a programmable gate array.

A plurality of spaced patch areas may be provided on the circuit board 87 to simplify routing of the interconnections. In one embodiment, the terminals for all the input signals are provided on one level in a patch area, and the output terminals are provided on another level.

If the programming of the interconnections is complex, directly printing the interconnections in an X-Y plane on the substrate 50 may be insufficient. Direct printing of conductors on the substrate is limiting, since a minimum spacing between conductors is about 30 microns to avoid cross-bridging, and thin conductors have a tendency to break up by surface tension.

In situations where it is not desired for the conductor lines to be directly printed, a mask layer is first formed on the substrate followed by the deposition of the conductor ink over the mask layer as follows.

One approach to pattern the interconnection traces, or to pattern any other traces on the circuit board 87, or to pattern the groups of devices 40, is to form hydrophobic masks. The masks may be deposited by printing (e.g., using a patterned roller or screen printing) or may be patterned by a photo-lithographic process (if printing cannot achieve the desired precision). One suitable masking substance is thoroughly cleaned diatomaceous earth particles infused in a solution as an ink. The ink is printed in a pattern that is negative to the desired wiring/device pattern. After curing, the resultant film is activated via a fluorination process, yielding a super-hydrophobic surface (i.e., it will not wet by the conductor ink or the device ink). The area of the substrate that is exposed by the film will be either mildly hydrophilic or super-hydrophilic (i.e., it will wet by the conductor ink or the device ink).

For forming the traces, a hydrophilic conductive ink is prepared and deposited over the hydrophobic mask. The exposed substrate areas will be covered by the ink, and the conductive ink that has been deposited on the hydrophobic mask surface will pile up in the exposed areas. This yields a greater cross-sectional area of the conductive ink (for good conductivity and mechanical strength) and prevents cross-bridges.

FIG. 12 is a top down view of the hydrophobic mask 94 defining areas 96 exposing the substrate. FIG. 13 is a cross-sectional view showing a single conductor 98 formed in one of the areas 96. Note that the conductor 98 is thicker than the mask 94. The height of the conductor 98 is determined by the amount of conductive ink deposited over the mask. For masks defining a large exposed area of the substrate, more conductive ink needs to be deposited to ensure that the exposed areas are fully covered by the ink. At termination areas of the traces, such as for connecting the ends of the traces to other conductors, an expanded pad area should be formed to ease alignment tolerances for a subsequent printed layer and to improve the resulting electrical connection.

After curing the conductive ink, a dielectric ink is then deposited over the same mask, where the dielectric ink contains sufficient surfactant to cover the mask surface and the conductors and neutralize the hydrophobic effects of the mask. Additional mask and trace layers may be formed to create a 3-dimensional matrix of interconnections. Vertical vias may be used for interconnections between conductor layers.

FIG. 14 illustrates the use of a hydrophobic mask 100 over the circuit board 87 of FIG. 11 when creating the interconnections between groups 72 and 74 to create an AND gate. In another embodiment, the mask 10 is only used in the patch area 86 for programming, and the traces 85 leading to the various groups are formed when printing the various conductor layers for the groups.

This general masking process may also be used for patterning the groups of devices 40 and conductor layers. Groups of the same or different devices may be stacked to allow the formation of very complex circuits.

The programming process may be inexpensively performed in a roll-to-roll process on a large number of the flexible circuit boards 87 after the standard features of the circuit boards 87 have been formed. After the final programming, the circuit boards 87 may be singulated from the roll. As seen, no vacuum processing or dangerous materials are used to fabricate the circuit board 87 and program it.

FIG. 15 illustrates how the resistors R1 and R2 in FIG. 14 may be formed by flexography or screen printing the resistive material on the substrate, where a mask on the screen mesh defines the shapes of the resistive material. Other deposition techniques may be used. Either the shape of the resistive material (length, width, height) may determine the resistance or the position of the connector 102 or 103 along its length may determine the resistance. If the position of the connector determines the resistance, all the resistors may be formed identically. The resistance can also be selected by interconnecting resistors in series and/or parallel.

Figure 16:
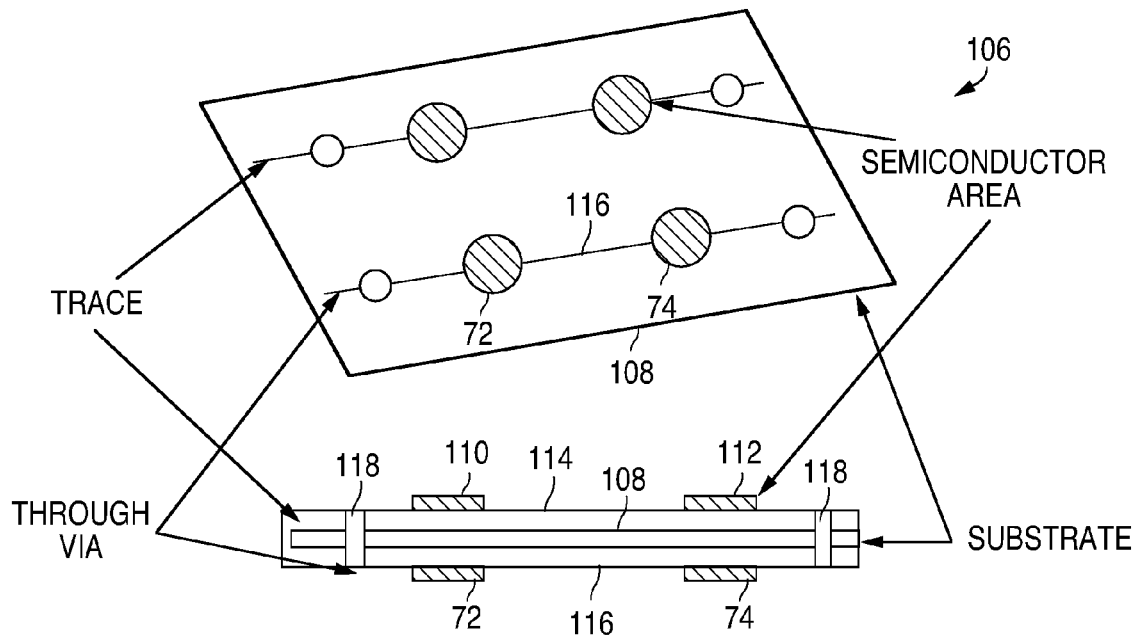
FIG. 16 illustrates how the devices may be printed on both sides of a substrate and interconnected by a through via.

FIG. 16 illustrates both a bottom view and a cross-sectional view of a circuit board 106 where both sides of the substrate 108 have printed thereon the groups of devices, such as groups 72 and 74 on the bottom and other groups 110 and 112 on the top. The traces 114 and 116 interconnect the groups. Through vias 118 connect the circuits on one side to the circuits on the other side. Prior to printing the interconnect layer, the via holes are punched in the substrate 108 and filled with a UV-cured hole-filling conductor, for example. If mirror images are formed, this simplifies the interconnection design, since the patch areas on both sides can be the same.

Instead of vias, a wrap-around connector can be used.

Since the substrate 108 may be a very thin and flexible film (like a flex-circuit), the resulting circuit board 106 may be folded to reduce its size. Flexible conductors formed by inks are commercially available. There may be special areas on the substrate 108 that define where the circuit board 106 may be folded without damage to the circuitry.

To improve reliability and flexibility in the usage of the circuit boards, a "base" circuit board 120 (FIG. 17) may be fabricated to have certain basic features and connection terminals. After the circuit board 120 has been tested and approved, additional circuit boards 122 and 124 may be electrically attached to the base circuit board 120 to customize the performance for a particular application.

Figure 17:
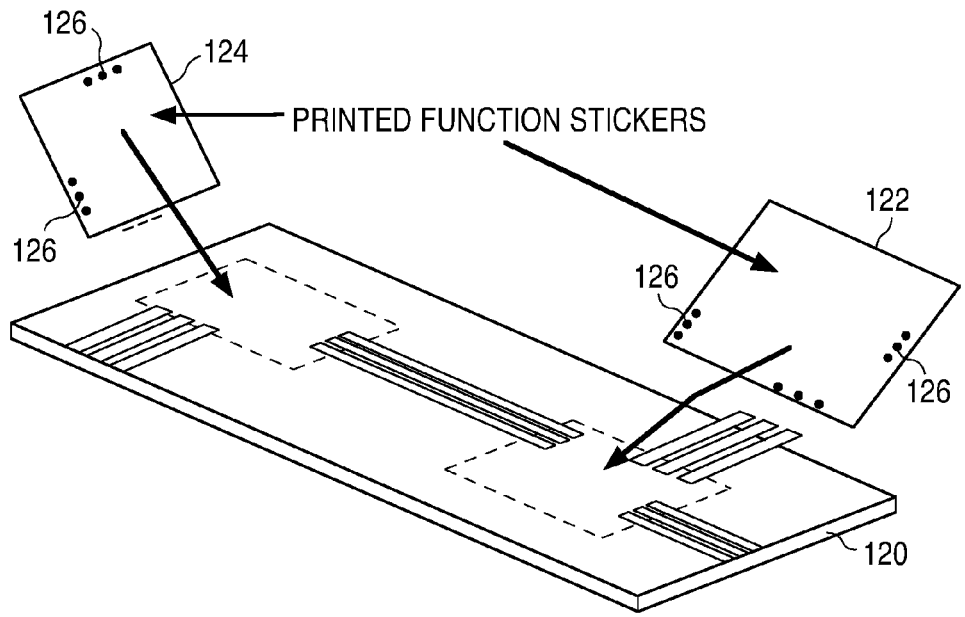
FIG. 17 illustrates how circuits may be printed on relatively small substrates and tested, then the small substrates are attached to a larger "base" substrate during a customizing step.

In the embodiment of FIG. 17, the tested and approved circuit boards 122 and 124 have an adhesive applied to its surface that will be adhered to the base circuit board 120. The terminals 126 of the circuit boards 122 and 124 align with terminals on the base circuit board 120. Those terminals 126 are coated with a conductive adhesive. The circuit boards 122 and 124 are then aligned with the base circuit board 120 and adhered to the surface of the base circuit board 120. In one embodiment, the "device side" of the circuit boards 122 and 124 face the device side of the base circuit board 120. By forming various functional units separately, the pass rate for each unit during testing will be higher, and the functional units can be connected in various combinations to add more functional possibilities.

In one embodiment, the circuit boards 122/124 are formed in a roll-to-roll process and, after testing, the adhesives are applied at the final station. The circuit boards 122/124 may have test tabs that are cut during singulation. After singulation, the circuit boards 122/124 are adhered to the base circuit board 120. As an arbitrary example, one circuit board 122 may be an A/D converter and the other one may be a D/A converter.

Figure 18:
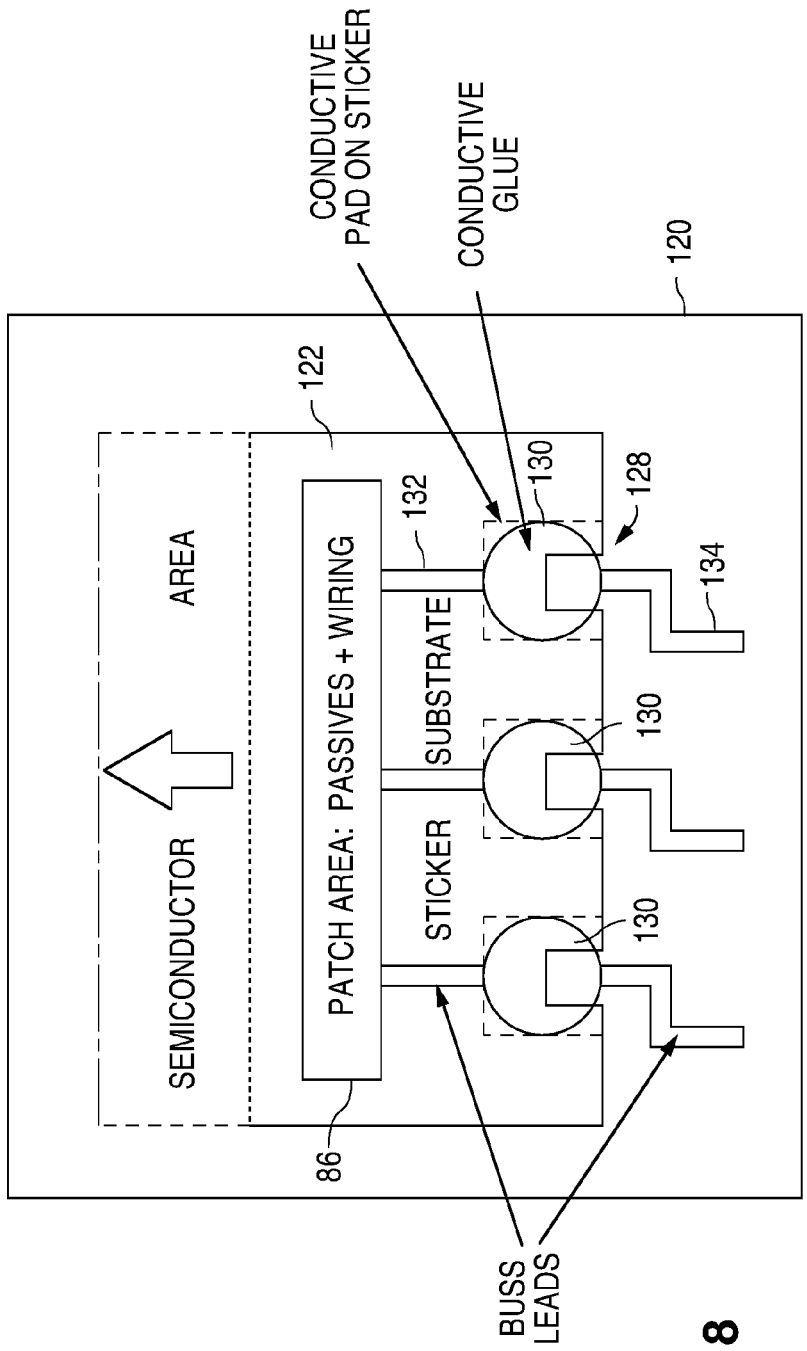
FIG. 18 illustrates how electrodes on the small substrate of FIG. 17 may be bonded to electrodes on the base substrate.

FIG. 18 illustrates another technique for mounting the circuit board 122 to the base circuit board 120. In FIG. 18, the circuit board 122 is perforated at the electrical connection locations at areas 128. The bottom side (non-device side) of the circuit board 122 is then coated with a dielectric adhesive, and the circuit board 122 is adhered to the base circuit board 120 so the perforations are over the connection terminals on the base circuit board 120. A conductive adhesive 130 is then deposited through the perforations to connect the terminals of the base circuit board 120 to the top terminals of the circuit board 122. For example, the traces 132 and 134 are connected by the conductive adhesive 130.

This technique can also be used with the double-sided circuit board of FIG. 16.

Using massively redundant arrays of devices (e.g., devices 40 in FIG. 11), along with the standard passive devices (e.g., resistors R1-R3 in FIG. 11) in the patch areas 86, allows the circuit boards to have a very high pass rate and creates programmable circuit boards that can be later programmed to make unique devices on an as-needed basis.

For higher densities of the groups of the devices, multiple insulated layers of the groups may be printed to form a 3-dimensional structure. Vertical vias may be used to gain access to the various layers. Groups of the devices may be connected in series using vertically aligned groups.

Figure 19:
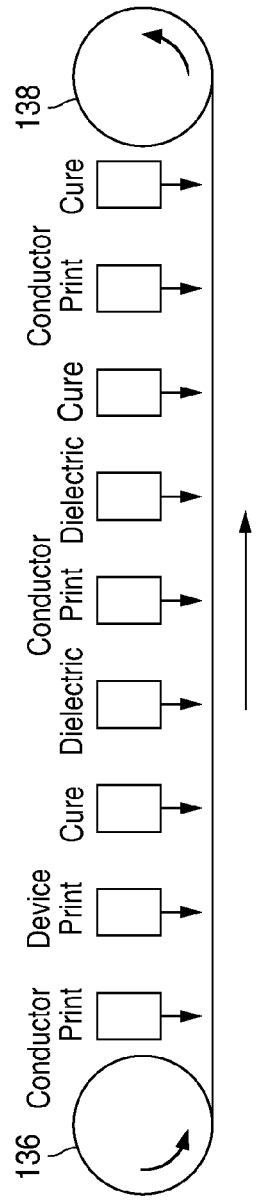
FIG. 19 illustrates a roll-to-roll process that may be used to form the circuits.

FIG. 19 schematically illustrates one possible assembly line for manufacturing the circuits by printing in a roll-to-roll process. The roll 136 contains the substrate material, and the roll 138 is a take-up roll. The various stations are labeled. The process sequentially prints the various layers and cures the layers. Flexography is preferred for printing using a roll-to-roll process. The number of layers depends on the complexity of the circuits and the devices printed. The roll-to-roll process may produce the unprogrammed circuit boards, and a separate system may be used for the final programming step, depending on a particular customer need.

The various directional attributes used herein, such as bottom, top, and vertical, are not to be construed to convey absolute directions relative to the Earth's surface but are used to convey orientations relative to the enclosed figures when the drawing sheets are held upright. In an actual embodiment, such terms still apply to the product regardless of the absolute orientation of the product relative to the Earth's surface.

For complex circuits requiring a large number of electrical components, it may be desirable to print a high density of very small dots of the devices in highly defined locations, such as in an array. Each dot acts as a single electrical component. A limiting factor with printing the dots is that there is some spreading of the liquid (i.e., ink containing the devices) on the substrate irrespective of the print pattern. The liquid used for the device ink is designed for the fluid dynamics needed for achieving the proper orientation of the microscopic electronic devices and is not optimized for limiting spreading once printed on the substrate. Further, conventional print masks, such as screen printing, have a limited resolution, where the resolution must take into account that the mask must pass the electronic devices. The below methods can be used to greatly reduce the size of the dots, increase the density of the dots, and improve the accuracy of the positioning of the dots.

Using the below methods, the separation of the dots can be reduced to about 3 microns, and the diameter of the dots can be smaller than achievable using conventional printing methods for the device ink.

Generally, the method entails patterning a hydrophobic (or omniphobic) layer on the substrate. The patterning may be by using a high resolution print mask or even photolithographic patterning. The hydrophobic material is optimized for printing (e.g., optimized viscosity for limited spreading) so can be patterned to a much higher resolution and accuracy compared to the device ink printing. The hydrophobic layer is patterned to create very small and dense openings that expose the substrate. The bottom conductor layer may be printed so that each opening in the hydrophobic layer contains a device contact pad, along with traces that lead to a patch area on the substrate. The conductor layer may be squeegeed across the surface to fill in the openings, or the hydrophobic layer can pattern the conductor layer by its hydrophobic action, or both. Thus, the conductor layer and the traces are self-aligned with the patterned hydrophobic layer.

The device ink can then be deposited over the patterned hydrophobic layer and conductor layer, and the ink will be repelled from the hydrophobic layer and only reside in the openings. Capillary action causes all the liquid to reside in the openings, forming device dots. Therefore, it is the patterning of the hydrophobic layer that defines the dots rather than a device ink print mask. The ink may be blanket deposited without a print mask, or a print mask may be used to roughly pattern the dots for more economical use of the ink. The device ink can also be squeegeed across the hydrophobic layer to fill in the openings. The device ink is then cured, and the electrical components, such as transistors or diodes, have the proper orientation so that the bottom terminals of the devices ohmically connect to the bottom conductor layer.

A dielectric layer is then printed, followed by printing a top conductor layer over the devices to connect the devices in each opening in parallel. The top conductor layer may include traces that extend to the patch area. Thus, the top conductor layer may also be self-aligned to the devices using the hydrophobic layer. The hydrophobic layer repels all the device and conductive inks printed. The hydrophobic layer can also form walls so the one or more printed layers may be squeegeed over the surface to only reside in the openings. In either case, the resolution and positioning of all the layers are defined by the hydrophobic layer. Multiple hydrophobic layers may be patterned for defining different printed layers.

Figure 20:
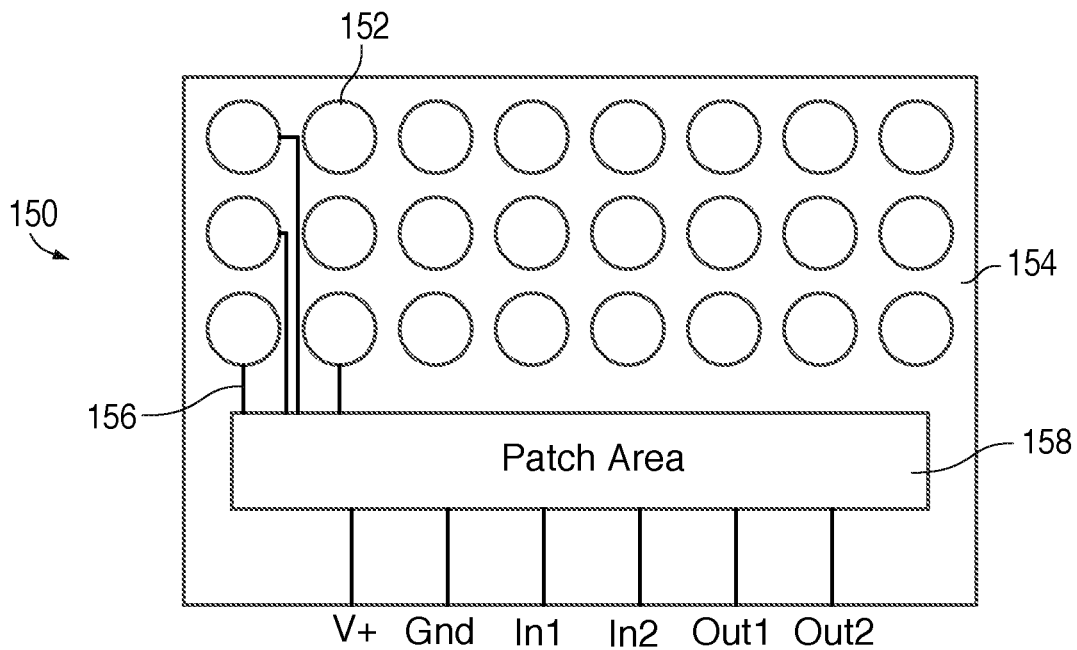
FIG. 20 is a top down view of a programmable circuit where each dot represents a printed group of electrical devices, and where the dot areas are defined by a patterned omniphobic layer (or hydrophobic layer).

FIG. 20 is a top down view of a programmable circuit 150 where each dot 152 represents a printed group of electrical devices (e.g., the devices 40 in FIG. 3), and where the dot areas are defined by a patterned omniphobic layer 154. The omniphobic layer 154 may also define the conductor areas and traces 156 that lead to a patch area 158 for interconnecting the top and bottom conductors for each dot 152 to create virtually any type of digital circuit or even an analog circuit. For three-terminal devices, such as transistors, there would be three or more layers of conductors. The array of dots 152 can include a variety of devices, such as bipolar and MOS transistors, resistors, diodes, etc. Electrical terminals for the circuit may include the power terminals V+ and ground, differential input terminals In1 and In2, and differential output terminals Out1 and Out2. The entire circuit 150 can be formed by printing under atmospheric conditions.

Figure 21:
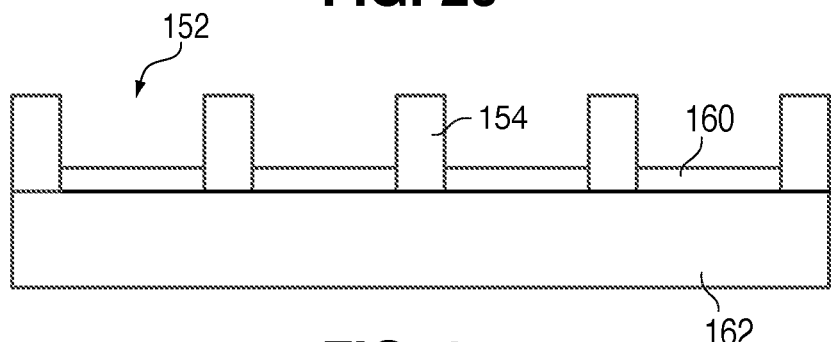
FIG. 21 is a cross-section of the circuit of FIG. 20 bisecting four dots, after the omniphobic layer is printed and after a bottom conductor layer is printed. The bottom conductor layer forms isolated contacts for the later-printed devices and may include traces leading to the patch area shown in FIG. 20.

FIG. 21 is a cross-section of the circuit 150 of FIG. 20, bisecting four dots 152, after the omniphobic layer 154 is printed and after a bottom conductor layer 160 is printed. The omniphobic layer 154 need not be formed directly on the substrate 162 surface. The bottom conductor layer 160 forms isolated contacts for the later-printed devices and may include traces leading to the patch area 158 shown in FIG. 20. The omniphobic layer may be a conventional omniphobic material that is printed using screen printing, flexography, or other printing methods. Such a material may be a fluorine based material, such as Teflon, or other commercially available material. Various materials are known that repel different liquids, and the selection of such omniphobic materials would depend on the solution used for the device ink and the conductor inks. The solutions may be alcohol-based. The omniphobic layer 154 may be a hydrophobic layer. The omniphobic layer 154 may also be a layer that has very fine roughening that causes overlying layers to essentially be supported by a cushion of air to prevent wetting. The omniphobic material may be optimized for fine patterning, which can be much finer than the patterning of the device ink using conventional screen printing and flexography techniques. For example, the device ink solution is selected for the proper fluid dynamics to allow the microscopic devices to have the proper orientation when they settle on the bottom conductor. The device ink solution may have very low viscosity, which causes a printed dot to spread, which limits the density of the dots. Further, the device ink print resolution may be limited due to the sizes of the microscopic devices in the ink. In contrast, the omniphobic material has no such limitations and can be patterned to a resolution of only a few microns. Further, any small spreading by the liquid ominphobic layer 154 will desirably make the openings smaller and, thus, the dot sizes smaller since it is a negative image of the dot pattern.

In one embodiment, the omniphobic material is first printed and cured to define the various dots areas and conductor pattern. Photolithography may also be used for even finer patterning. The substrate 162 may be any suitable material, such as PMMA, FR-4, paper, etc.

The conductor ink is then printed, which may comprise metal particles in a solution. The conductor ink may be printed in the openings of the omniphobic layer 154 or may be blanket deposited and squeegeed over the surface to fill the openings in the omniphobic layer 154. In one embodiment, the conductor ink layer extends to the height of the omniphobic layer 154 prior to curing, so the surface is planar. Curing the conductor ink layer, to form the bottom conductor layer 160, will cause some contraction. Any subsequent device ink or conductor ink will also be repelled from the omniphobic surface and accumulate over the bottom conductor layer 160. Therefore, all printed layers are self-aligned.

Figure 22:
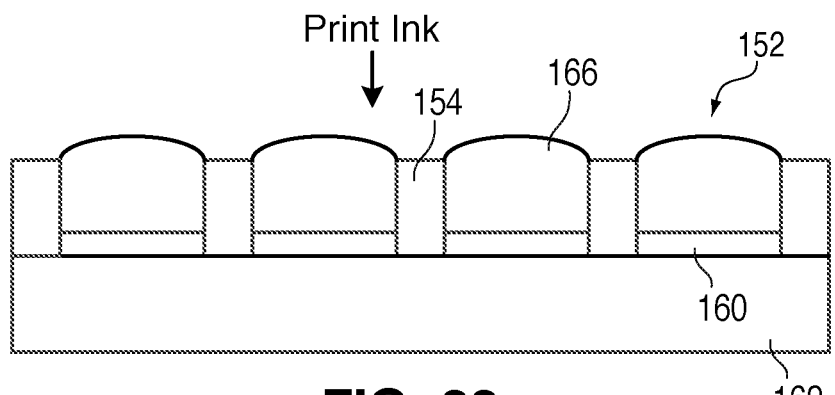
FIG. 22 illustrates the structure after the device ink is printed, where the omniphobic layer defines the shapes of the dots and conductors.

FIG. 22 illustrates the structure after the device ink 166 is printed, where the omniphobic layer 154 defines the shapes of the dots 152 and conductors. Even if the device ink 166 is blanket-printed, all the ink will reside in the openings due to the repulsion by the omniphobic layer 154.

Figure 23:
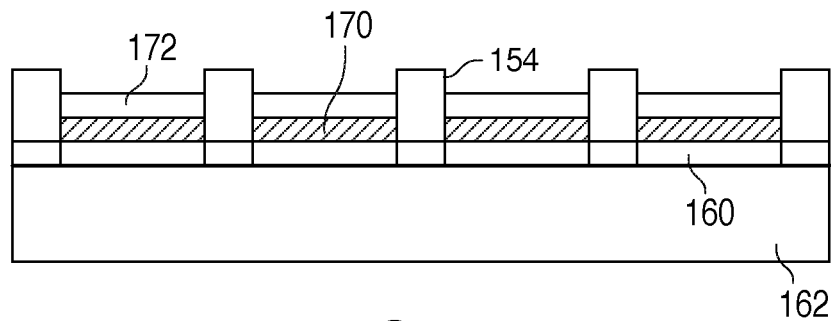
FIG. 23 illustrates the structure after the device ink is cured, and after a dielectric layer is printed, and after a top conductor layer is printed.

FIG. 23 illustrates the structure after the device ink is cured to create a monolayer of electrical devices 170 whose bottom terminals electrically contact (e.g., ohmically contact) the bottom conductor layer 160. A dielectric layer, such as the dielectric layer 60 in FIG. 4, is then printed to insulate the bottom conductor layer 160. Then, a top conductor layer 172 is printed and cured to ohmically contact the top terminals of the electrical devices 170. If the electrical devices 170 have three tiers of terminals, such as the transistor shown in FIG. 4, an additional conductor layer and dielectric layer would be printed.

The top conductor layer 172 may be defined using another patterned omniphobic layer (outside the cross-section of FIG. 23), which enables the top conductors and bottom conductors to overlap. In such an embodiment, the omniphobic properties of the first omniphobic layer 154 may have to be neutralized by a corona-treat process in order to deposit another omniphobic layer over it and over any other portion of the surface. Whether a liquid wets a material well or poorly depends primarily on the chemical nature of both the liquid and the surface. Wetting is defined as the ratio between the surface energies of the liquid and surface. In general the following rule is true: A material will be wetted if its surface energy (=dyn/cm) is higher than the surface energy of the liquid. If not, there will be an adhesion problem. The pre-treatment offered by corona treatment may be necessary to obtain sufficient wetting and adhesion before the printing. A corona discharge unit can optimize the wetting and adhesion. This corona technique has proved to be both highly effective and cost-effective and can take place in-line. Such corona treatment is well known.

The top and bottom conductor layers for each dot 152 area are electrically isolated and may have traces 156 (FIG. 20) that extend to the patch area 158 of FIG. 20 for interconnection using a programming mask to customize the circuit. The programming may be performed by depositing a metal or by other techniques. Examples of circuits that can be formed include state machines, memories, clocks, logic circuits, and even analog circuits. Some of the groups of electrical devices may be connected in parallel for conducting higher currents, such as for LED drivers, etc.

For an array of a large number of dots 152, the conductor pattern may become overly complex and significant parasitic capacitances of overlying traces can occur.

Figure 24:
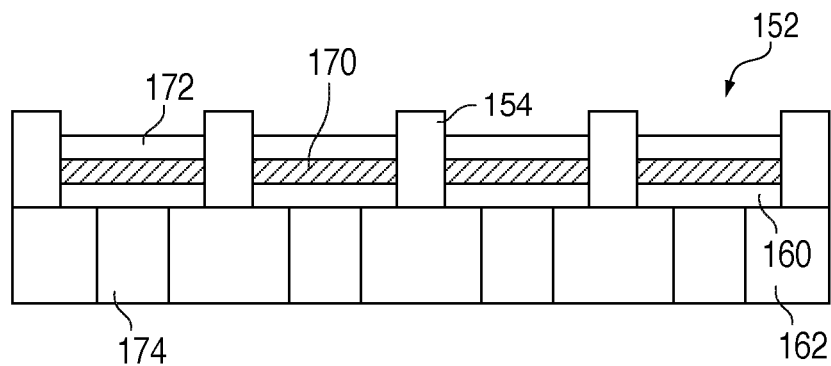
FIG. 24 illustrates an alternate embodiment where the bottom conductor layer, for each isolated dot, extends to the bottom side of the substrate to ease routing of the traces and to reduce parasitic capacitance effects.

FIG. 24 illustrates an alternate embodiment where the bottom conductor layer 160, for each isolated dot 152, electrically extends to the bottom side of the substrate 162 by using conductive through-vias 174 to ease routing of the traces and reduce parasitic capacitance effects. Thus, the bottom side of the substrate 162 would include all the bottom conductor traces leading to the patch area 158 (FIG. 20).

Figure 25:
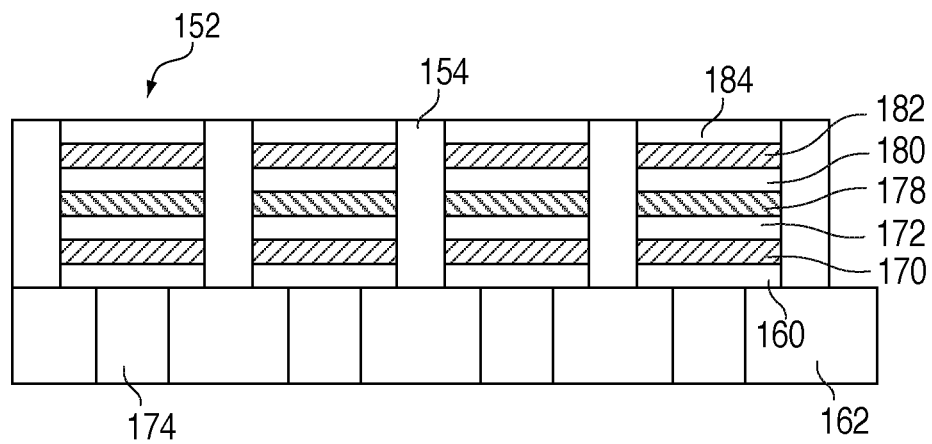
FIG. 25 illustrates how the programmable circuit may include any number of device layers to increase the device density.

FIG. 25 illustrates how the programmable circuit may include any number of device layers to increase the device density. In FIG. 25, a dielectric layer 178 is printed over the conductor layer 174, followed by another conductor layer 180, followed by another device layer 182, followed by another conductor layer 184. Basically, the steps are the same as forming the layers of FIGS. 21-24. Any number of layers may be formed for any circuit complexity.

Figure 26:
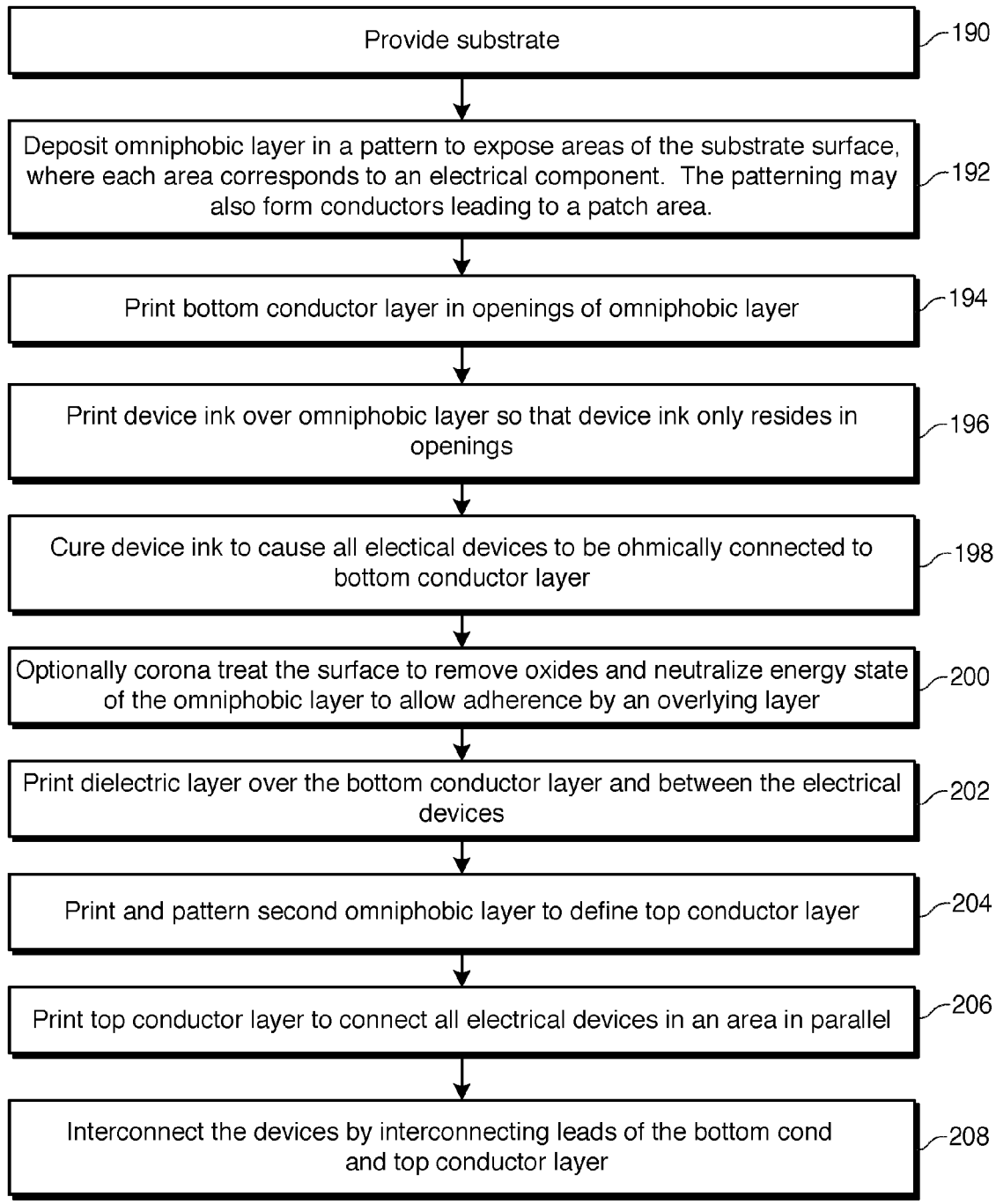
FIG. 26 is a flowchart identifying steps used to form the programmable circuit of FIG. 20.

FIG. 26 is a flowchart identifying steps used to form the programmable circuit 150 of FIG. 20.

In step 190, a suitable substrate is provided.

In step 192, the omniphobic layer is printed in a pattern to expose areas of the substrate surface where the isolated device dots are to be formed and to also define the conductor pattern. The conductor pattern may include traces leading to a patch area.

In step 194, the bottom conductor layer is printed, where the conductor ink only resides in the openings in the omniphobic layer. The conductor ink printing process may roughly define the conductor pattern, and the omniphobic layer then precisely defines the conductor pattern. The conductor ink is then cured.

In step 196, the device ink is printed over the surface such that the device ink is defined by the patterning (openings) of the omniphobic layer.

In step 198, the device ink is cured to cause the bottom terminals of the devices to be electrically (e.g., ohmically) connected to the bottom conductor layer.

In step 200, the surface of the omniphobic layer is optionally subjected to a corona treatment to neutralize the surface. This allows subsequent layers to be formed over the neutralized omniphobic layer, such as for printing a new omniphobic layer for defining the subsequent layers.

In step, 202, a dielectric layer is printed over the bottom conductor layer and between the electrical devices for insulating the bottom conductor layer.

In step 204, a second omniphobic layer may be printed to define the top conductor layer.

In step 206, the top conductor layer is printed and cured to electrically (e.g., ohmically) contact the top terminals of the electrical devices and connect all electrical devices in a single dot in parallel, such as shown in FIG. 4. The programmable circuit is now complete, assuming the devices only require two terminals.

In step 208, the programming of the circuit is performed, such as pursuant to a customer request, by interconnecting the various leads of the bottom and top conductor layers to form any type of logic circuit or analog circuit.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A circuit comprising:
   a substrate;
   a first material overlying the substrate and patterned to define first openings;
   a plurality of separate groups of pre-formed, semiconductor electrical devices that have been mixed in a first solution, deposited over the substrate, and cured,
   each group containing a plurality of substantially identical electrical devices connected in parallel within each group, the electrical devices being randomly distributed within each group on the substrate,
   wherein the first material prevents wetting by the first solution such that the first solution resides only within the first openings, resulting in each group of the substantially identical electrical devices being defined by the first openings in the first material;
   an interconnection conductor pattern that is programmable to interconnect at least some of the groups together to achieve an electrical function;
   one or more input terminals for supplying an input signal; and
   one or more output terminals for supplying an output signal, wherein the input signal is transformed by the electrical devices after the interconnection conductor pattern is programmed, and the transformed signal is output at the one or more output terminals.

2. The circuit of claim 1 wherein the first material is hydrophobic.

3. The circuit of claim 1 wherein the first material is omniphobic.

4. The circuit of claim 1 further comprising a first conductor layer that is defined by the first openings in the first material, where in the first conductor layer electrically contacts the electrical devices.

5. The circuit of claim 1 further comprising:
   a second material deposited over the first material and patterned to have second openings; and
   a conductive material deposited in the second openings, the conductive material being deposited in a second solution,
   wherein the second material prevents wetting by the second solution such that the second solution resides only within the second openings, resulting in the conductive material being defined by the second openings in the second material.

6. The circuit of claim 1 wherein each group has at least one electrical connector that extends from its associated group, wherein each electrical connector terminates at a termination area, and wherein the interconnection conductor pattern comprises conductors that electrically connect to the groups at the termination area.

7. The circuit of claim 1 wherein the devices are deposited by printing.

8. The circuit of claim 1 wherein the devices have a largest dimension less than 200 microns.

9. The circuit of claim 1 wherein each group in the plurality of separate groups contains substantially identical first devices, wherein the plurality of separate groups is a first plurality of separate groups, the circuit further comprising a second plurality of separate groups, wherein the groups with the second plurality contain second devices different from the first devices.

10. The circuit of claim 1 wherein the devices comprises at least one of transistors or diodes.

11. The circuit of claim 1 wherein the devices are 3-terminal devices having a first electrode, a second electrode, and a third electrode, wherein the first electrode is a bottom electrode of the devices, the third electrode is a top electrode of the devices, and the second electrode is an intermediate electrode located vertically between the top electrode and the bottom electrode, the circuit further comprising:
   a first conductor layer over the substrate, wherein the first electrode of the devices is electrically connected to the first conductor layer;
   a first dielectric layer overlying the first conductor layer;
   a second conductor layer overlying the first dielectric layer to electrically contact the second electrode;
   a second dielectric layer over the second conductor layer; and
   a third conductor layer overlying the second dielectric layer to electrically contact the third electrode,
   wherein the devices are electrically connected in parallel by a combination of the first conductor layer, the second conductor layer, and the third conductor layer.

12. The circuit of claim 1 wherein the substrate has a patch area, wherein each group has at least one electrical connector that extends from its associated group and terminates in the patch area, and wherein the interconnection conductor pattern comprises conductors that electrically connect to the groups at the patch area.

13. The circuit of claim 1 wherein the interconnection conductor pattern interconnects the groups to form logic gates.

14. The circuit of claim 1 wherein the interconnection conductor pattern interconnects the groups to perform logic functions.

15. The circuit of claim 1 wherein the interconnection conductor pattern interconnects the groups to create analog circuits.

16. A method for forming a circuit comprising:
   patterning a first material overlying a substrate to define first openings;
   depositing a first solution over the first material, the first solution containing pre-formed, semiconductor electrical devices,
   wherein the first material prevents wetting by the first solution such that the first solution resides only within the first openings;

curing the first solution containing pre-formed, semiconductor electrical devices such that electrical terminals of the electrical devices electrically contact a first conductor layer overlying the substrate, the electrical devices located in each of the first openings forming groups of the electrical devices defined by the first openings in the first material, the electrical devices in each group being connected in parallel; and forming at least one conductor layer to enable interconnecting at least some of the groups to achieve an electrical function.

17. The method of claim 16 further comprising:

forming one or more input terminals for supplying an input signal; and forming one or more output terminals for supplying an output signal, wherein the input signal is transformed by the electrical devices after an interconnection conductor pattern is programmed, and the transformed signal is output at the one or more output terminals.

18. The method of claim 16 further comprising interconnecting the groups to form logic gates.

19. The method of claim 16 wherein the first material is omniphobic.

20. The method of claim 16 wherein the first material is hydrophobic.

* * * * *